United States Patent [19]

Shibuya

[11] Patent Number: 5,383,154

[45] Date of Patent: Jan. 17, 1995

[54] MEMORY CIRCUIT CAPABLE OF EXECUTING A BIT MANIPULATION AT A HIGH SPEED

[75] Inventor: Tadashi Shibuya, Tokyo, Japan

[73] Assignee: NEC Corporation, Tokyo, Japan

[21] Appl. No.: 26,459

[22] Filed: Mar. 4, 1993

[30] Foreign Application Priority Data

Mar. 4, 1992 [JP] Japan .................................. 4-046484

[51] Int. Cl.$^6$ .............................................. G06F 3/14
[52] U.S. Cl. ............................ 365/189.01; 395/100;
  395/115; 395/400; 395/425
[58] Field of Search ............... 365/189.01; 371/10;
  395/100, 115, 400, 425

[56] References Cited

U.S. PATENT DOCUMENTS

| | | | |
|---|---|---|---|
| 4,710,767 | 12/1987 | Sciacero et al. | 340/799 |
| 4,779,223 | 10/1988 | Asai et al. | 364/900 |
| 4,851,834 | 7/1989 | Stockebrand et al. | 340/801 |

FOREIGN PATENT DOCUMENTS 62-269076 11/1987 Japan .

*Primary Examiner*—Eugene R. LaRoche
*Assistant Examiner*—Viet Q. Nguyen
*Attorney, Agent, or Firm*—Whitham, Curtis, Whitham & McGinn

[57] ABSTRACT

A memory circuit includes a RAM having a memory cell section and a bit manipulation section for controlling a writing of a bit unit to the memory cell section. The RAM is configured to be able to be read and written at different timings by at least two devices. A register stores mask bits for controlling an operation of the bit manipulation section for each bit of data written to the memory cell section. In the bit manipulation operation, a content of a memory cell within the memory cell corresponding to an inactive bit in the register is rewritten by the bit manipulation section, but a content of a memory cell within the memory cell corresponding to the active bit in the register is maintained as it is.

3 Claims, 7 Drawing Sheets

MEMORY CIRCUIT CAPABLE OF EXECUTING A BIT MANIPULATION AT A HIGH SPEED

BACKGROUND OF THE INVENTION

1. Field of the Invention

The present invention relates to a memory circuit used in a field of data processing, and more specifically to a bit manipulation circuit capable of using one memory in common.

2. Description of Related Art

In microcomputers configured to use one memory in common, generally, a time sharing system is used in which one common memory is accessed (read or written) at different timings by a central processing unit (called a "CPU" hereinafter) and a peripheral function section including for example a timer and an interrupt controller. In this time sharing system, if the common memory is not accessed by one of the CPU and the peripheral function section, the other of the CPU and the peripheral function section can access the common memory. Conventionally, the common memory used in the time sharing system has been so constructed that 8 bits of data in the common memory are accessed as one unit by the CPU and the peripheral function section access. However, in the case that the memory is used as a flag or the like, the 8-bit data is often used in units of one bit. This is ordinarily called a "bit manipulation".

In the case of executing the bit manipulation, the 8-bit data to which the bit manipulation is to be executed is read out of the memory, and the read-out 8-bit data is supplied to a logic gate such as an AND gate or an OR gate so that an objective bit of the read-out 8-bit data is set or reset, and thereafter, the read-out 8-bit data is subjected to an arithmetic and logic operation. The read-out 8-bit data subjected to the arithmetic and logic operation is written back to the same location (address) of the memory as that of the memory from which the 8-bit data was read out. This sequential operation is called a "read-modify-write" operation.

In this "read-modify-write" operation, the peripheral function section performing the bit manipulation accesses to the memory when the data is read from the memory and when the data subjected to the arithmetic and logic operation is written to the memory, but does not access the memory when the arithmetic and logic operation is being performed for the read-out data.

For example, when the CPU performs the bit manipulation for data of the memory, there is possibility that during a period in which the CPU performs the arithmetic and logic operation for the read-out data, the peripheral function section rewrites the data stored in the location (address) of the memory as that of the memory from which the 8-bit data was read out by the CPU. In order to prevent this situation, the conventional microprocessor has included a flag bit for inhibiting the memory access of the peripheral function section during not only a memory access period of the CPU but also a period of the bit manipulation. This flag bit is called a "semaphore bit". This semaphore bit is also provided in association with the peripheral function section in order to prevent a similar situation when the peripheral function section performs the bit manipulation for dan of the memory.

Thus, in the conventional microcomputers, when the read-modify-write operation for the bit manipulation is performed by one of the CPU and the peripheral function section, the semaphore bit is activated to inhibit the memory access made by the other of the CPU and the peripheral function section, during the period in which the one of the CPU and the peripheral function section performs the arithmetic and logic operation for the read-out data. Therefore, a substantial time has been required for each one operation of the bit manipulation. In addition, since the memory can be accessed only after the semaphore bit is checked, the performance of the CPU resultantly lowers.

SUMMARY OF THE INVENTION

Accordingly, it is an object of the present invention to provide a memory circuit which has overcome the above mentioned defect of the conventional one.

Another object of the present invention is to provide a memory circuit capable of executing each one bit manipulation at a high speed and capable of allowing the CPU to exert its performance with no decrease.

The above and other objects of the present invention are achieved in accordance with the present invention by a memory circuit including a random access memory having a memory cell section and a bit manipulation section for controlling a writing of a bit unit to the memory cell section, the random access memory being able to be read and written at different timings by at least two devices, and a register for controlling an operation of the bit manipulation section for each bit of data written to the memory cell section, so that a content of a memory cell within the memory cell corresponding to the bit allowed to be written by the register is rewritten by the bit manipulation section, but a content of a memory cell within the memory cell corresponding to the bit inhibited by the register from being written is maintained as it is.

The above and other objects, features and advantages of the present invention will be apparent from the following description of preferred embodiments of the invention with reference to the accompanying drawings.

DESCRIPTION OF THE PREFERRED EMBODIMENTS

Figure 1:
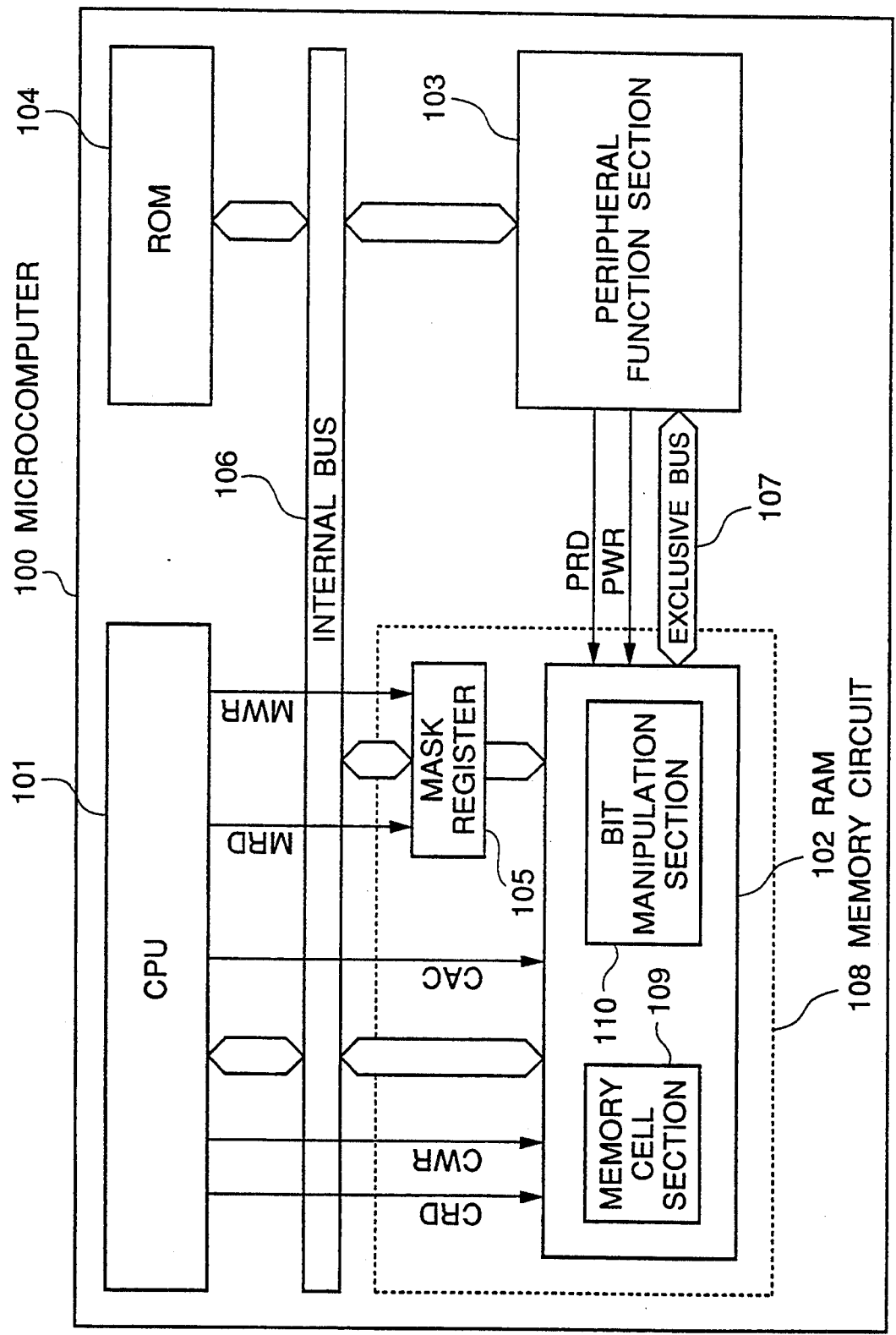
FIG. 1 is a block diagram of a microcomputer including therein a first embodiment of the memory circuit in accordance with the present invention.

Referring to FIG. 1, there is shown a block diagram of a microcomputer including therein a first embodiment of the memory circuit in accordance with the present invention.

The shown microcomputer, generally designated by Reference Numeral 100, includes a CPU 101 for performing various arithmetic and logic operations, a ROM (read only memory) 104 storing programs of the CPU 101 for the arithmetic and logic operations, a peripheral function section 103 including for example a timer and an interrupt controller, a memory circuit 108 including a RAM (random access memory) 102 for storing data used by the CPU 101 and the peripheral function section 103, as shown. The CPU 101, the RAM 102, the peripheral function section 103 and the ROM 104 are coupled to an internal bus 106, so that data transferred through the internal bus 106 between the CPU 101, the RAM 102, the peripheral function section 103 and the ROM 104. In addition, the RAM 102 and the peripheral function section 103 are coupled through an exclusive bus 107, so that the RAM 102 can be read and written directly by the peripheral function section 103 through the exclusive bus 107 but with no intermediary of the internal bus 106.

The CPU 101 generates a CPU read signal CRD to the RAM 102 when the CPU 101 reads the RAM 102, and a CPU write signal CWR to the RAM 102 when the CPU 101 writes in the RAM 102. In addition, the CPU 101 generates a CPU access signal CAC indicating that the CPU 101 accesses the RAM 102. On the other hand, the peripheral function section 103 generates a peripheral function section read signal PRD to the RAM 102 when the peripheral function section 103 reads the RAM 102, and a peripheral function section write signal PWR to the RAM 102 when the peripheral function section 103 writes in the RAM 102.

In addition, the memory circuit 108 also includes a mask register 105, which is coupled to the internal bus 106 and the RAM 102, and which is controlled by the CPU 101 to realize a data transfer between the internal bus 106 and the RAM 102. For this purpose, the CPU 101 generates a mask register read signal MRD to the mask register 105 when the CPU 101 reads data held in the mask register 105, and also generates a mask register write signal MWR to the mask register 105 when the CPU 101 writes data into the mask register 105. Furthermore, the RAM 102 includes a memory cell section 109 and a bit manipulation section 110.

Figure 2:
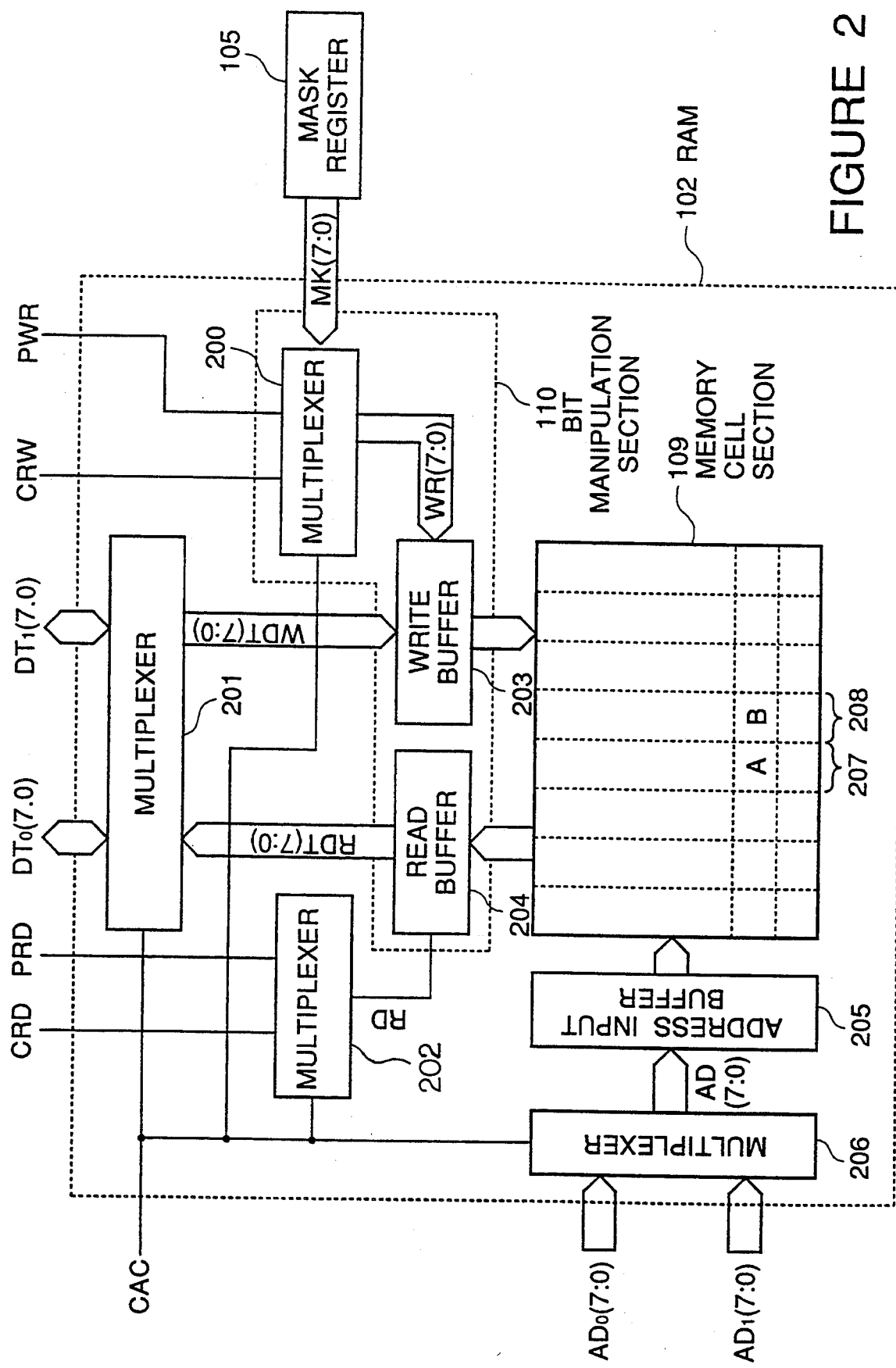
FIG. 2 is a block diagram of the memory circuit shown in FIG. 1.

Referring to FIG. 2, there is shown a block diagram of the memory circuit shown in FIG. 1. As shown in FIG. 2, in addition to the memory cell section 109 and the bit manipulation section 110, the RAM 102 includes a multiplexor 206 receiving an address $AD_0(7:0)$ (for example from the exclusive bus 107) and an address $AD_1(7:0)$ (for example from the internal bus(106) for determining an address AD(7:0) to be supplied to the memory cell section 109, an address input buffer 205, and multiplexors 201 and 202 associated to the bit manipulation section 110. The RAM 102 also includes a write buffer 203 and a read buffer 204 for realizing a data transfer to and from the memory cell section 109, and a multiplexor 200 for supplying data from the mask register 105 to the write buffer 203. Namely, data on buses $DT_0(7:0)$ and $DT_1(7:0)$ is read from and written to the memory cell section 109. Incidentally, Reference Numerals 207 and 208 designate groups A and B of bit cells.

In the above mentioned RAM 102, data is read as follows: First, if the signal CAC is "0", the address $AD_0(7:0)$ is outputted from the multiplexor 206 to the address buffer 205 as the address AD(7:0), and if the signal CAC is "1", the address $AD_1(7:0)$ is outputted from the multiplexor 206 to the address buffer 205 as the address AD(7:0). With this, data written at an address indicated by the address buffer 205 is read out and outputted to the read buffer 204.

On the other hand, if the signal CAC is "0", the signal PRD is outputted from the multiplexor 202 to the read buffer 204 as a read signal RD, and if the signal CAC is "1", the signal CRD is outputted from the multiplexor 202 to the read buffer 204 as the read signal RD. Therefore, the read buffer 204 is activated by the read signal RD, so that the read buffer 204 outputs the read data RDT(7:0) to the multiplexor 201. At this time, if the signal CAC is "0", the multiplexor 201 outputs the read data as data $DT_0(7:0)$ (for example to the exclusive bus 107), and if the signal CAC is "1", the multiplexor 201 outputs the read data as data $DT_1(7:0)$ (for example to the internal bus 106).

Now, data is written to the RAM 102 as follows: When the signal CAC is "0", the multiplexor 201 outputs the data $DT_0(7:0)$ to the write buffer 203 as write data WDT(7:0), and when the signal CAC is "1", the multiplexor 201 outputs the data $DT_1(7:0)$ to the write buffer 203 as write data WDT(7:0). The writing to the memory cell section 109 is controlled by the multiplexor 200 which multiplexes a mask signal MK(7:0) from the mask register 105 and the signals CAC, CWR and PWR. Namely, an output of the multiplexor 200 is supplied to the write buffer 203 as write control data WR(7:0) so that the write buffer 203 is activated by the write control data WR(7:0). Thus, the input write data WDT(7:0) is written to the address indicated by the output of the address buffer 205 which is multiplexed on the basis of the signal CAC.

Figure 3:
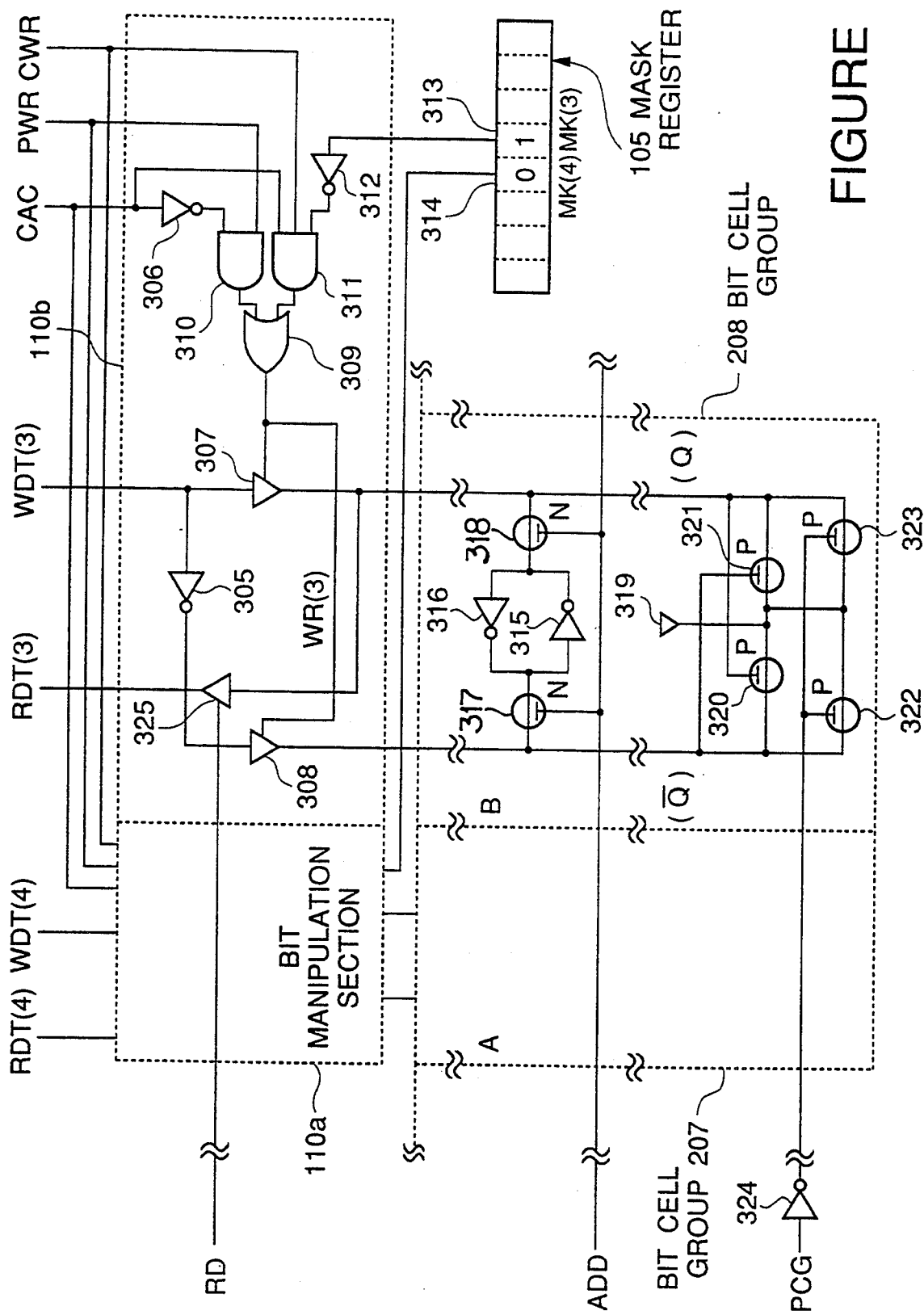
FIG. 3 is a circuit diagram of the bit cell groups and the bit manipulation section shown in FIG. 2.

Turning to FIG. 3, there is shown a circuit diagram of the bit cell groups and the bit manipulation section shown in FIG. 2. More specifically, FIG. 3 shows a third bit cell group 208 and a fourth bit cell group 207 within the memory cell section 109 and a circuit portion of the write buffer 203 and the multiplexor 200 corresponding to the third and fourth bits, namely bit manipulation units 110a and 110b. Each of bit cells of the RAM 102 is constituted similarly to the bit cell group 208, and therefore, the bit cell group 207 is constituted similarly to the bit cell group 208.

First, a general construction of each bit cell of the RAM will be described with reference to the bit cell B. The bit cell B corresponding to one bit of the RAM 102 includes a pair of inverters 315 and 316 each having its output connected to an input of the other inverter. The outputs of the inverters 315 and 316 are connected to a pair of bit lines through a pair of n-channel MOS transistors 317 and 318, respectively, which has their gate connected to receive a signal ADD indicative of an address for 8-bit data including the bit cell B. If the signal ADD is "1", a pair of data items Q and $\overline{Q}$ are connected to the pair of bit lines through the MOS transistors 317 and 318, respectively. The pair of bit lines Q and $\overline{Q}$ are connected to a sense amplifier composed of a pair of p-channel MOS transistors 320 and 321 connected as shown, and to a precharge circuit composed of another pair of p-channel MOS transistors 322 and 323 connected as shown.

When the bit cell B is read, assuming the output of the inverter 315 of the bit cell B is "1", the output of the inverter 316 of the bit cell B is "0", and therefore, the output of the inverter 315 of the bit cell B does not change. Namely, the inverters 315 and 316 continue to maintain their outputs. In other words, the bit cell B stores that the data Q is "1".

When a precharge signal PCG is brought to "1", an output of an inverter 324 is brought to "0", and therefore, the pair of p-channel MOS transistors 322 and 323 are turned on, so that the pair of bit lines Q and $\overline{Q}$ are connected to a voltage supply terminal 319. However, when the precharge signal PCG is brought to "1", the signal ADD is never brought to "1", the data of the bit cell B does not change. On the other hand, when the precharge signal PCG is at "1", the operation for reading the bit cell B is performed.

Namely, the signal ADD is brought to "1", the n-channel MOS transistors 317 and 318 are turned on, so that the bit cell B is connected to the bit lines Q and $\overline{Q}$. Therefore, the non-inverted bit line Q is brought to "1" by the output of the inverter 315, and the inverted bit line $\overline{Q}$ is brought to "0" by the output of the inverter 316. Since the inverted bit line $\overline{Q}$ is at "0", the p-channel MOS transistor 321 is turned on so that the voltage supply line 319 is connected to the non-inverted bit line Q. Therefore, the non-inverted bit line Q of the bit cell group 208 is positively maintained at "1", and the inverted bit line $\overline{Q}$ is positively maintained at "0". At this time, if the read signal RD is at "1", a read buffer 325 is activated so that the data "1" of the bit cell B is outputted as a bit data RDT(3) of the bit cell group 208.

Here, assuming that the bit cell B is "0", since the p-channel MOS transistor 320 is turned on so that the voltage supply line 319 is connected to the inverted bit line $\overline{Q}$, the data of the bit cell B is similarly outputted to the read buffer 204 as the data item of "0".

If the above mentioned read operation is completed, the signal ADD is brought to "0", and the outputted data is memorized in the bit cell B, again.

Next, an operation for writing the bit cell B will be explained. Here, assume that the data Q stored in the bit cell B is "1". Similarly to the mad operation, when the precharge signal PCG is at "0", the operation for writing the bit cell B is performed. When the signal ADD is brought to "1", the n-channel MOS transistors 317 and 318 are turned on, so that the bit cell B is connected to the bit lines Q and $\overline{Q}$. At this time, if a write data WDT(3) is "0", and a write signal WR(3) for the bit cell B is "1" so as to activate a pair of write buffers 307 and 308 having their outputs connected to the bit lines Q and $\overline{Q}$, respectively. Since an output of an inverter 305 is brought to "1", the write buffer 307 outputs "0" to the non-inverted bit line Q, and the write buffer 308 outputs "1" to the inverted bit line $\overline{Q}$. If the inverted bit line $\overline{Q}$ is brought to "1", the output of the inverter 315 is caused to change from "1" to "0".

When the above mentioned writing operation is completed, the signal ADD is brought to "0", and therefore, the n-channel MOS transistors 317 and 318 are turned off. At this time, since the output of the inverter 315 is at "0", the output of the inverter 316 is maintained at "1", and therefore, the output of the inverter 315 does not change. Thus, the bit cell B has been changed to store that the data Q is "0". Namely, the bit cell B has been rewritten, i.e., has been written.

Now, the bit manipulation for the memory cell section 109 of the RAM 102 will be explained. A circuit for performing the bit manipulation includes an inverter 306 receiving the signal CAC indicating that the CPU 101 is accessing, and an AND gate 310 receiving an output of the inverter 306 and the signal PWR which is brought to "1" when the peripheral function section 103 is writing. The circuit also includes an inverter 312 receiving an output MK(3) of a mask bit 313 of the mask register 105 corresponding to the bit cell group 208, and an AND gate 311 receiving an output of the inverter 312, the signal CAC, and the signal CWR which is brought to "1" when the CPU 101 is writing. Outputs of the AND gates 310 and 311 are connected to an OR gate 309, an output of which generates the write signal WR(3) for the bit cell group 208. In FIG. 3, the bit manipulation unit 110a is similar to the above mentioned bit manipulation unit 110b.

Figure 4:
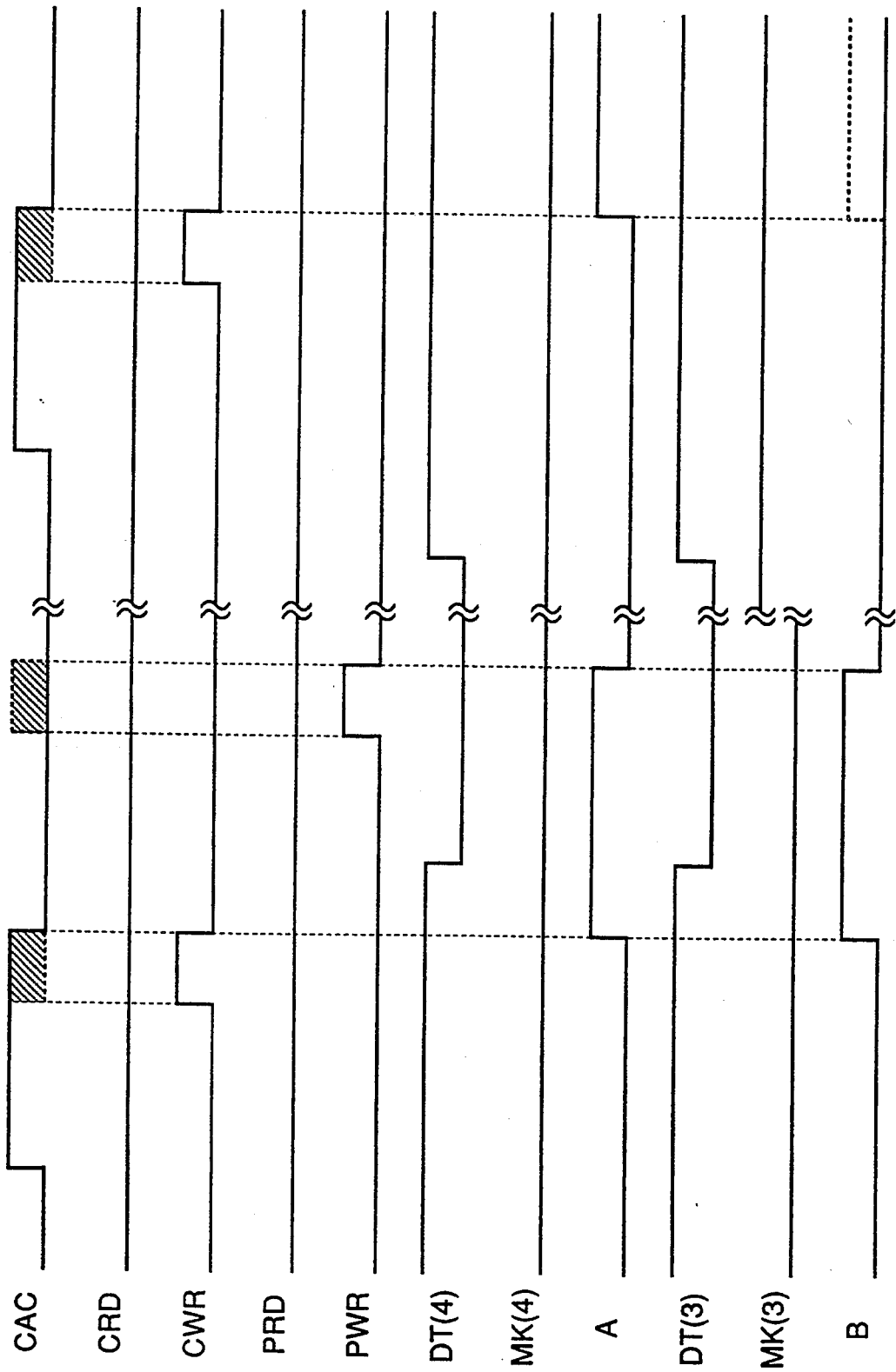
FIG. 4 is a timing chart illustrating an operation of the bit manipulation section shown in FIG. 3.

Now, operation of the bit manipulation section will be described with reference to FIG. 4, which illustrates a timing chart illustrating an operation of the bit manipulation section shown in FIG. 3.

When the bit manipulation is performed for the bit cell A and the bit cell B within the bit manipulation units 110a and 110b, assume that the bit cells A and B in the memory cell section 109 of the RAM 102 are "0", and the content MK(4) of the bit 314 in the mask register 105 is "0". At this time, the output of the inverter 312 in the bit manipulation unit 110a (having the same construction as that of the bit manipulation unit 110b) is brought to "1". Accordingly, similarly to the ordinary write operation, when the signal CAC is at "1", if the write data item WDT(4) is brought to "1", and also if the signal CWR is brought to "1", the output of the AND gate 311 becomes "1", and therefore, the output of the OR gate 309 also becomes "1". Accordingly, the write buffers 307 and 308 are activated, and the bit cell A is brought, similarly to the above mentioned write operation.

The operation when the content MK(3) of the bit 313 in the mask register 105 corresponding to the bit cell B is "0", is the same as the just above mentioned operation of the bit cell A, and therefore, explanation thereof will be omitted. Now, the operation when the content MK(3) of the bit 313 is "0" will be described. At this time, the output of the inverter 312 is brought to "0". Therefore, when the signal CAC is at "1", even if the signal CWR is brought to "1" similarly to the ordinary write operation, since the output of the AND gate 311 is maintained at "0", and therefore, the output of the OR gate is similarly at "0". Accordingly, the write buffers 307 and 308 are not activated. Thus, only the signal ADD is brought to "1" similarly to the above mentioned read operation, the data stored in the bit cell B is maintained as it is. In other words, the bit manipulation is not performed for the bit cell B.

If the signal CAC is at "0", it means that the CPU 101 does not access the RAM 102. At this time, the output of the inverter 306 is brought to "1", and if the peripheral function section 103 brings the signal PWR to "1" for the 8-bit data including the bit cell B, the output of the AND gate 310 is brought to "1", so that the output of the OR gate 309 is brought to "1". Accordingly, the write buffers 307 and 308 are activated so as to write the write data WDT(7:0).

In brief, the bit manipulation for the 8-bit data including the bit cells A and B can be performed with only the ordinary write operation by the 8-bit mask register 105.

Figure 5:
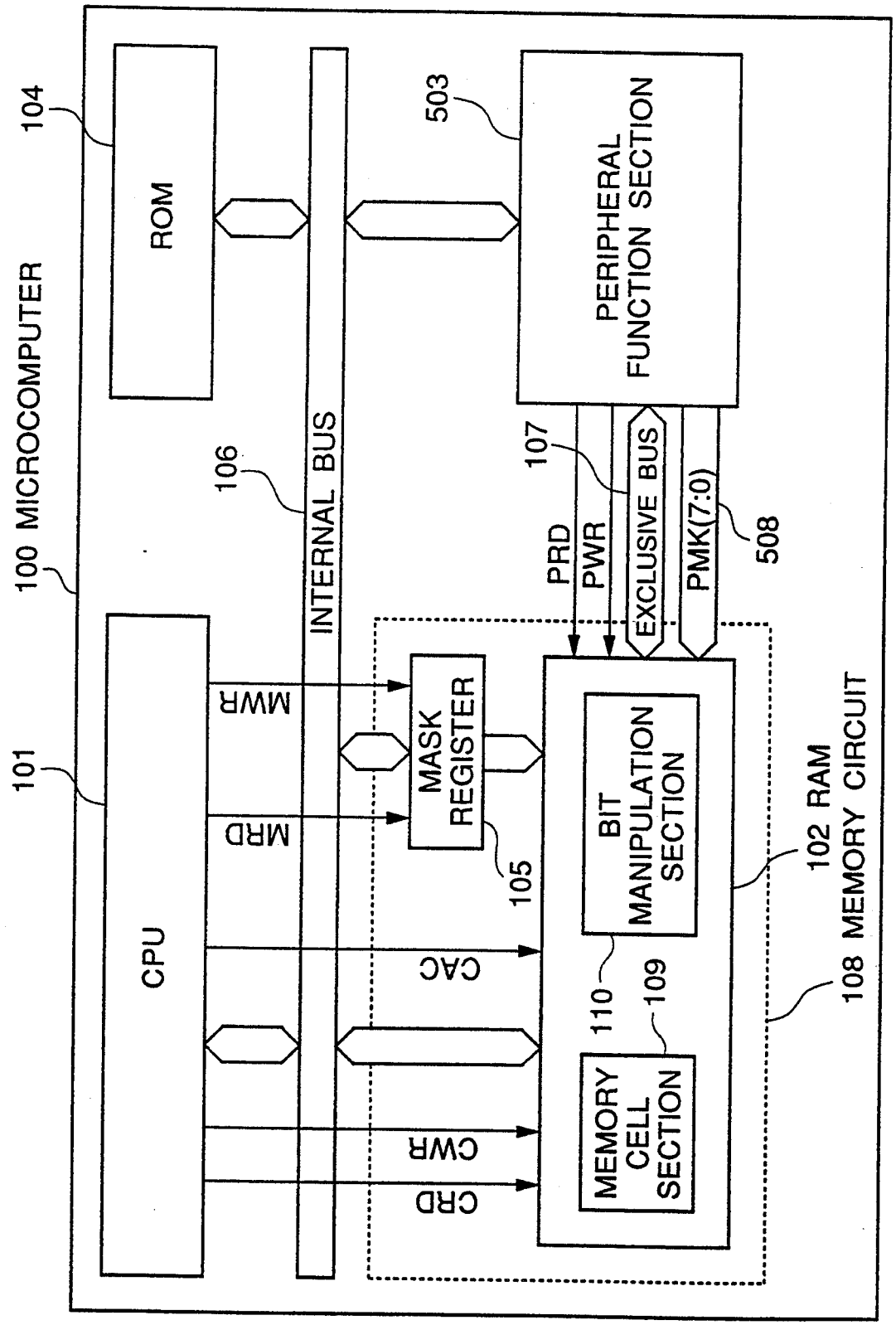
FIG. 5 is a block diagram of a microcomputer including therein a second embodiment of the memory circuit in accordance with the present invention.
Figure 6:
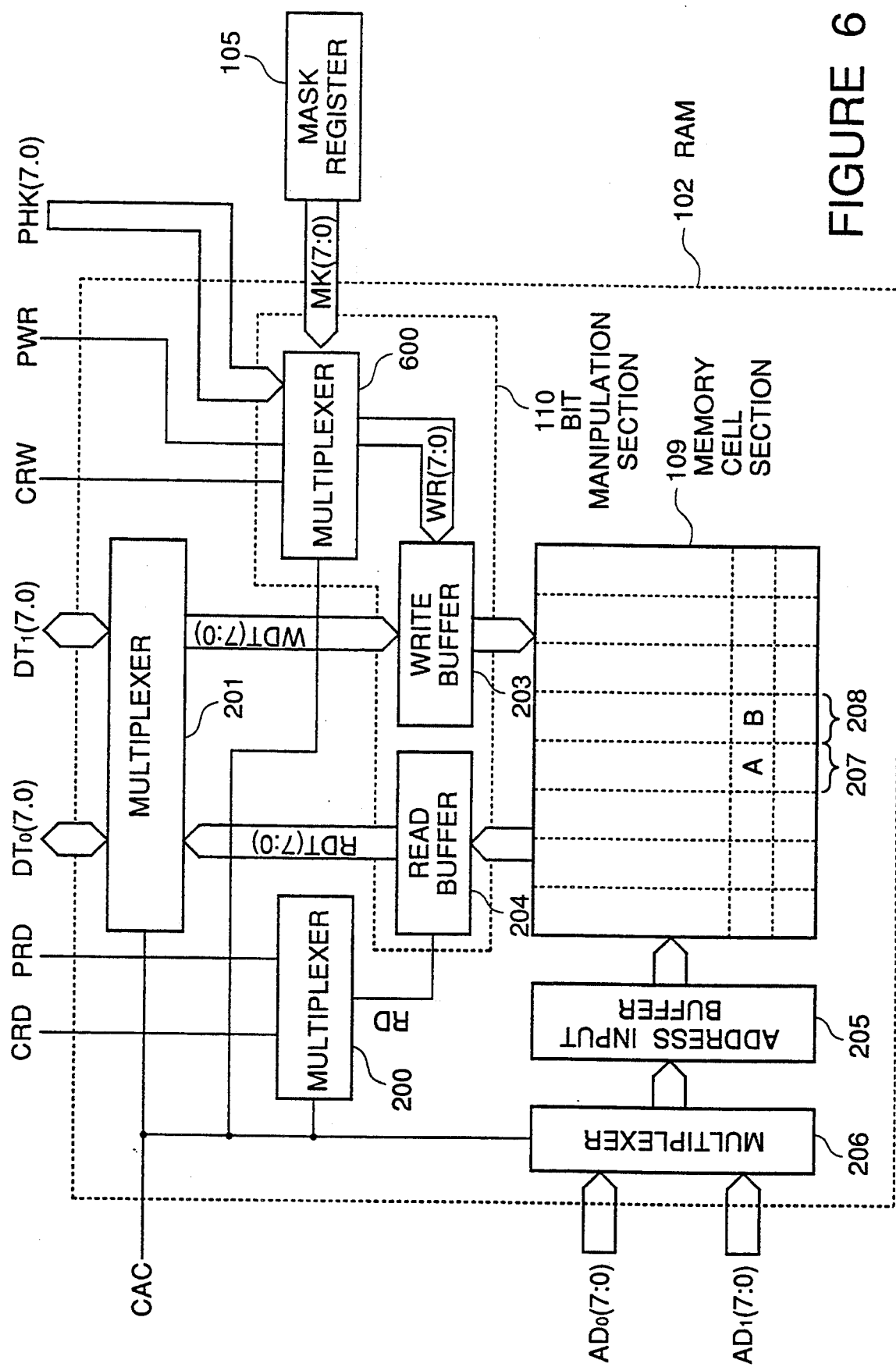
FIG. 6 is a block diagram of the memory circuit shown in FIG. 5.
Figure 7:
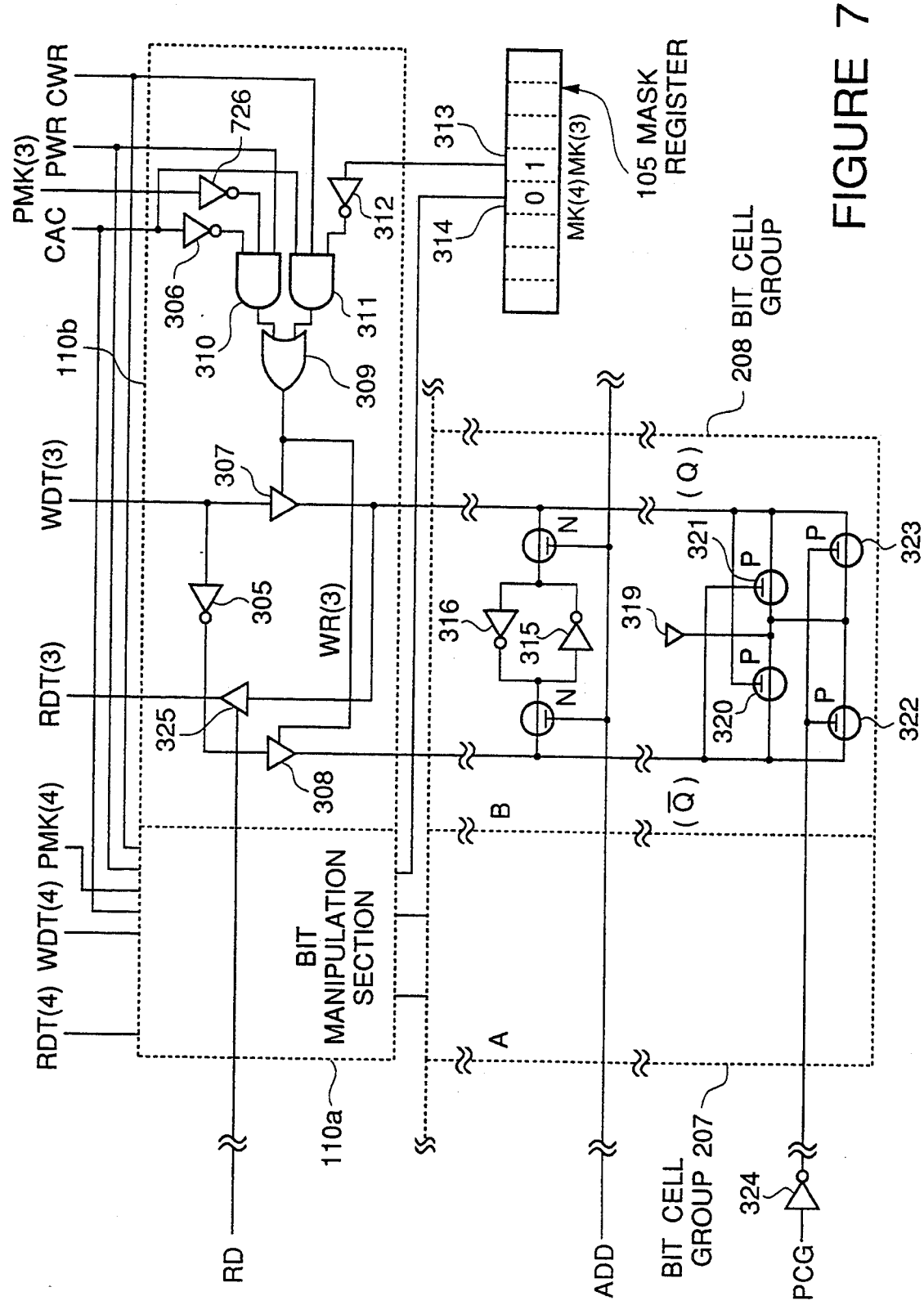
FIG. 7 is a circuit diagram of the bit cell groups and the bit manipulation section shown in FIG. 6.

FIG. 5 is a block diagram of a microcomputer including therein a second embodiment of the memory circuit in accordance with the present invention. In addition, FIG. 6 is a block diagram of the memory circuit shown in FIG. 5, and FIG. 7 is a circuit diagram of the bit cell groups and the bit manipulation section shown in FIG. 6.

The second embodiment is different from the first embodiment, in which mask signals PMK(7:0) are outputted from a peripheral function section 503 through a bus 508 to the RAM 102. The construction and the operation of the second embodiment, excluding the control performed by the mask signals PMK(7:0), are completely the same as those of the first embodiment. In FIGS. 5, 6 and 7, therefore, elements similar or corresponding to those shown in FIGS. 1, 2 and 3 are given the same Reference Numerals, and explanation thereof will be omitted. In addition, a difference between FIGS. 1 and 5 is that the mask signals PMK(7:0) are outputted from the peripheral function section 503, and the mask signals PMK(7:0) are supplied to a multiplexor 600 shown in FIG. 6, and a mask signal PMK(3) is applied to an input of an inverter 726 which is provided in the bit manipulation unit 110b for the corresponding bit and which has its output connected to the AND gate 310.

As would be understood from FIGS. 5, 6 and 7, an operation of the second embodiment is characterized in the following: When the mask signal PMK(3) is at "0", the output of the inverter 726 is brought to "1", and when the signal CAC is at "0", the output of the inverter 306 is brought to "1". At this time, if the signal PWR is brought to "1", the output of the AND gate 310 is brought to "1", and therefore, the output of the OR gate 309 is also brought to "1". Accordingly, in this case, a write operation can be performed similarly to the write operation of the first embodiment mentioned hereinbefore.

When the mask signal PMK(3) outputted from the peripheral function section 503 is at "1", the output of the inverter 726 is brought to "0", and when the signal CAC is at "0", the output of the inverter 306 is brought to "1". At this time, even if the signal PWR is brought to "1", the output of the AND gate 310 is at "0", and therefore, the output of the OR gate 309 is also at "0". Accordingly, in this case, the write buffers 307 and 308 are not activated. As a result, the bit cell B does not change. Therefore, the bit manipulation for the 8-bit data can be performed with only the ordinary write operation from the peripheral function section 503 by the mask signals PMK(7:0) supplied from the peripheral function section 503.

As will be seen from the description of the embodiments with reference to the drawings, the memory circuit in accordance with the present invention is characterized in that, when the bit manipulation is performed in a time shared access, the bit manipulation can be executed similarly to the ordinary write operation, by masking the write signal in units of one bit. Therefore, one operation of the bit manipulation can be performed at a high speed. In addition, since the semaphore bits are not used, the performance of the CPU can be utilized with no decrease.

The invention has thus been shown and described with reference to the specific embodiments. However, it should be noted that the present invention is in no way limited to the details of the illustrated structures but changes and modifications may be made within the scope of the appended claims.

I claim:

1. A memory circuit including
  a random access memory having a memory cell section and a bit manipulation section for controlling a writing of a bit unit to said memory cell section, said random access memory being able to be read and written at different timings by at least two devices, and
  a register for controlling an operation of said bit manipulation section for each bit of data within said bit unit written to said memory cell section,
  said bit manipulation section including bit manipulation means for rewriting a content of a memory cell within said memory cell section corresponding to each bit of data allowed to be written under control of said register, and inhibiting rewriting a content of a memory cell corresponding to each bit which is inhibited from being written under control of said register.

2. A memory circuit claimed in claim 1 wherein said bit manipulation section includes a multiplexor connected to said register and a read buffer and write buffer connected to said memory cell section.

3. A memory circuit claimed in claim 1 wherein said register is a mask register.

* * * * *